United States Patent
Albrecht et al.

[19]

[11] Patent Number: 5,821,494
[45] Date of Patent: Oct. 13, 1998

[54] METHOD OF ELECTRICAL CONNECTION BETWEEN HEAD TRANSDUCER AND SUSPENSION BY SOLDER WIRE BUMPING AT SLIDER LEVEL AND LASER REFLOW

[75] Inventors: David W. Albrecht, San Jose, Calif.; Akihiko Aoyagi, Fujisawa, Japan; Surya Pattanaik, San Jose, Calif.; Yoshio Uematsu, Fujisawa, Japan

[73] Assignee: International Business Machines Corporation, Armonk, N.Y.

[21] Appl. No.: 722,536

[22] Filed: Sep. 27, 1996

[51] Int. Cl.⁶ .................................................. B23K 26/00
[52] U.S. Cl. .................................. 219/121.64; 29/603.06; 228/180.22; 228/111.5
[58] Field of Search ............................ 29/603.04, 603.06; 228/180.22, 111.5; 360/104; 219/121.64, 121.66, 121.85

[56] References Cited

U.S. PATENT DOCUMENTS

| | | |
|---|---|---|
| 3,463,898 | 8/1969 | Takaoka et al. . |
| 4,761,699 | 8/1988 | Ainslie et al. ........................... 360/103 |
| 4,789,914 | 12/1988 | Ainslie et al. ...................... 360/104 X |
| 4,893,742 | 1/1990 | Bullock ................................... 228/110 |
| 4,970,365 | 11/1990 | Chalco ............................... 219/121.63 |
| 4,996,623 | 2/1991 | Erpelding et al. ...................... 360/104 |
| 5,001,583 | 3/1991 | Matsuzaki ............................... 360/104 |
| 5,124,277 | 6/1992 | Tsumura . |
| 5,172,851 | 12/1992 | Matsushita et al. .................... 228/179 |
| 5,177,860 | 1/1993 | Yura et al. ........................... 29/603.07 |
| 5,187,623 | 2/1993 | Ibaraki .................................... 360/103 |
| 5,193,738 | 3/1993 | Hayes .................................... 228/180.2 |
| 5,298,715 | 3/1994 | Chalco et al. ...................... 219/121.64 |
| 5,299,729 | 4/1994 | Matsushita et al. ............... 228/180.22 |
| 5,327,310 | 7/1994 | Bischoff et al. ........................ 360/103 |
| 5,366,692 | 11/1994 | Ogashiwa ................................ 420/562 |
| 5,384,090 | 1/1995 | Ogashiwa ................................ 420/555 |
| 5,530,604 | 6/1996 | Pattanaik ................................. 360/104 |
| 5,680,275 | 10/1997 | Frater et al. ............................ 360/104 |
| 5,699,212 | 12/1997 | Erpelding et al. ...................... 360/104 |

FOREIGN PATENT DOCUMENTS

| | | |
|---|---|---|
| 0 671 727 A1 | 9/1995 | European Pat. Off. . |
| 0 683 491 A2 | 11/1995 | European Pat. Off. . |
| 62-173074 | 7/1987 | Japan . |
| WO 95/00279 | 1/1995 | WIPO . |

*Primary Examiner*—Gregory L. Mills
*Attorney, Agent, or Firm*—Gray Cary Ware Freidenrich

[57] ABSTRACT

A method of making a solder connection between a slider pad and a suspension pad is provided by forming a solder bump on the solder pad at the slider level, affixing the slider to the suspension so that solder can be reflowed between the slider pad and the suspension pad and then employing a laser beam to reflow at least the solder bump to form a solder connection between the slider pad and the suspension pad. Various embodiments of the method are employed for forming the solder connection. Geometric features are also optionally incorporated in the suspension pad region of the integrated suspension that can be employed to bias the suspension pads against the solder bumps in the pre-reflow state.

56 Claims, 12 Drawing Sheets

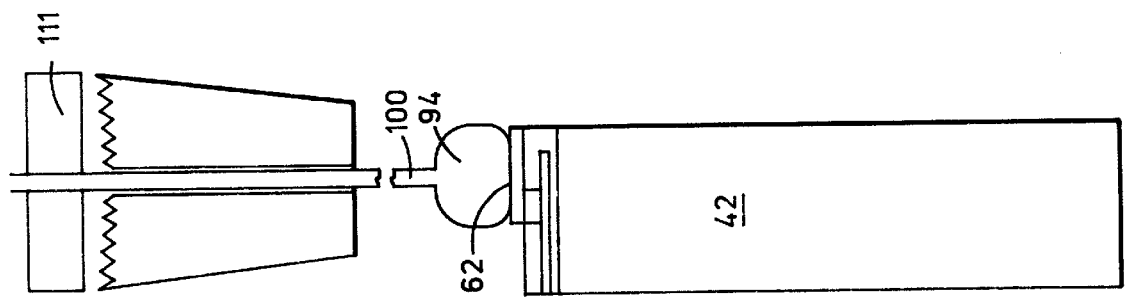
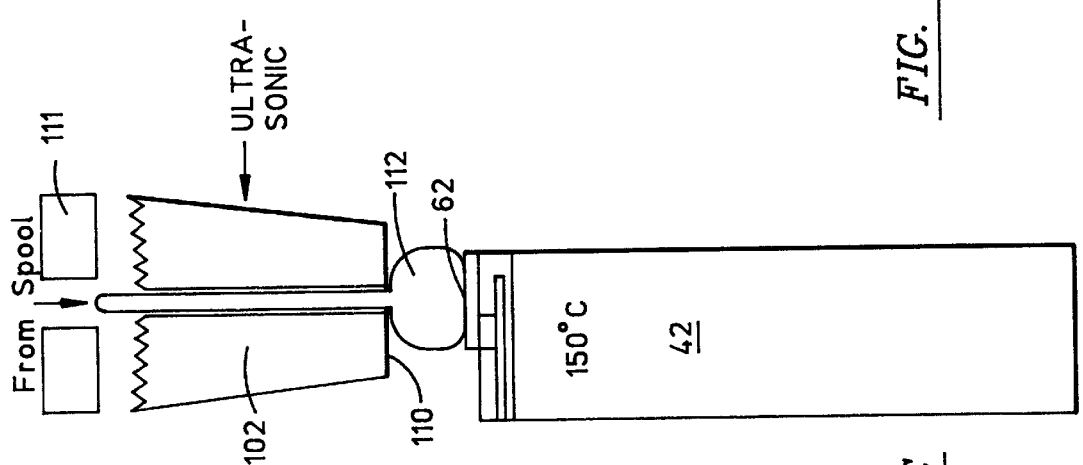
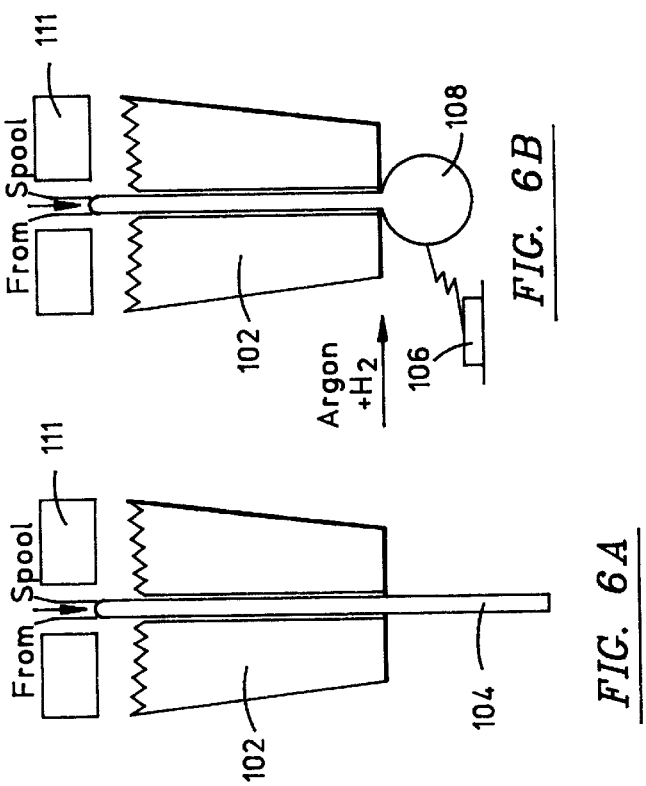
FIG. 6A
FIG. 6B
FIG. 6C
FIG. 6D

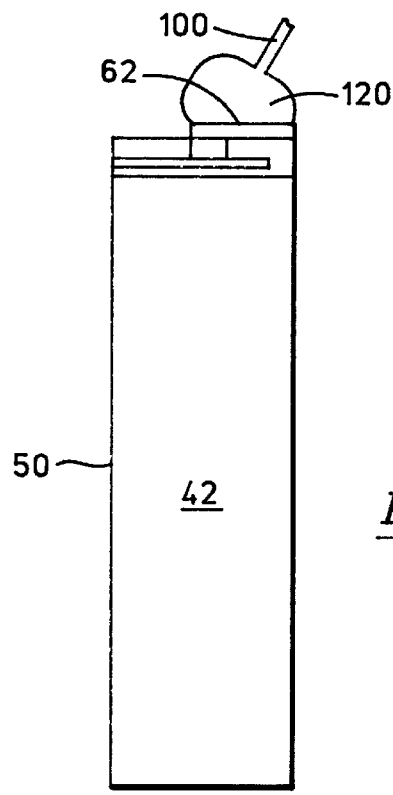
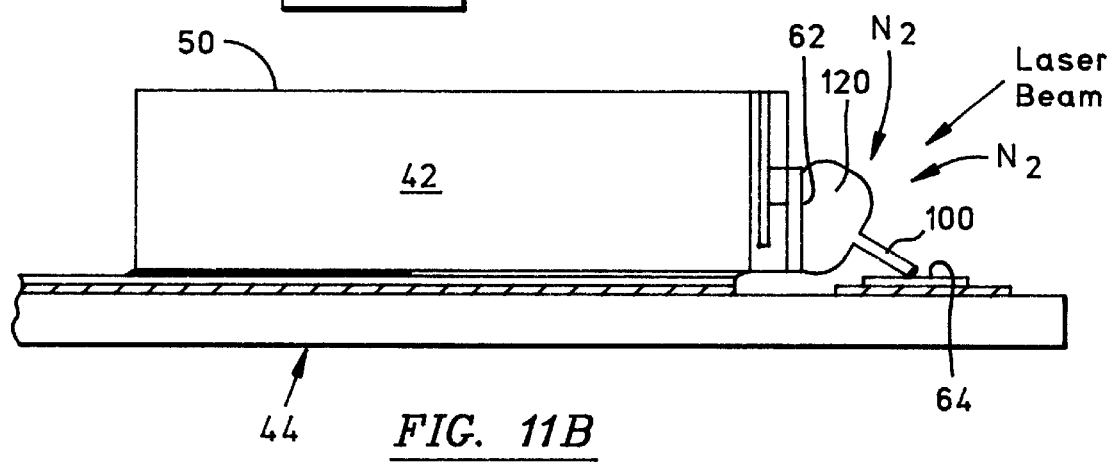
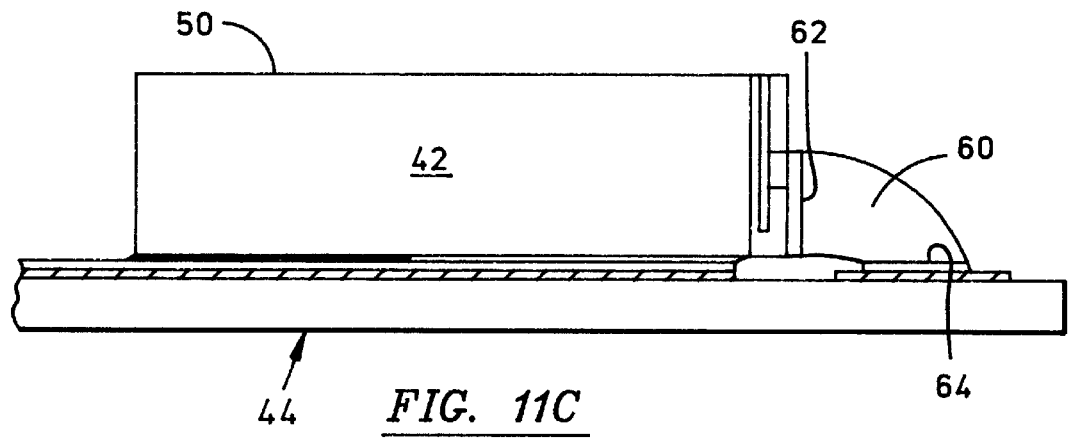

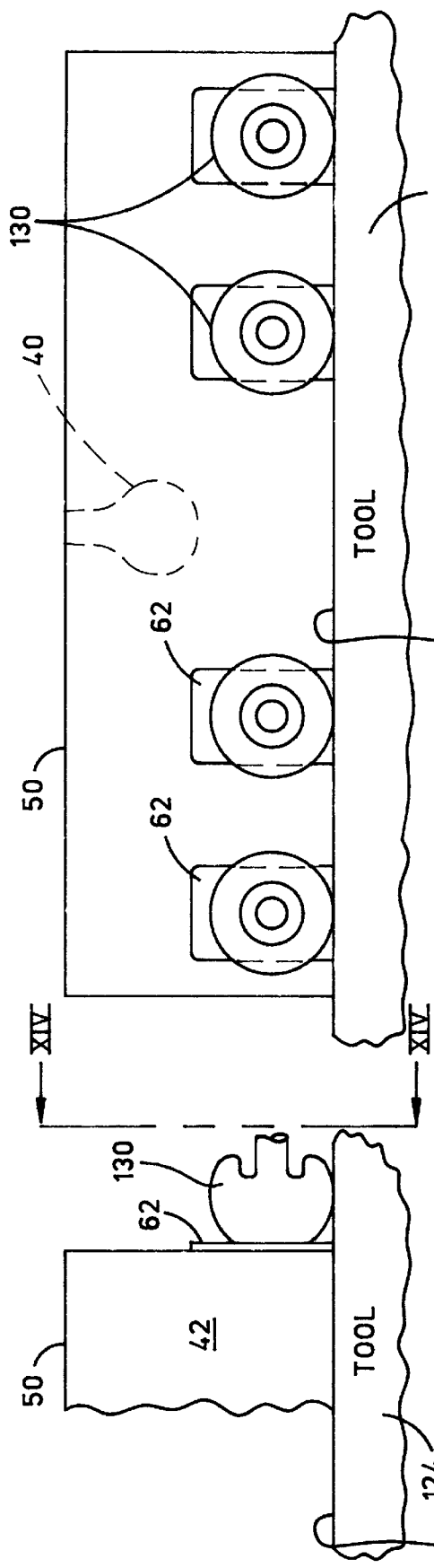

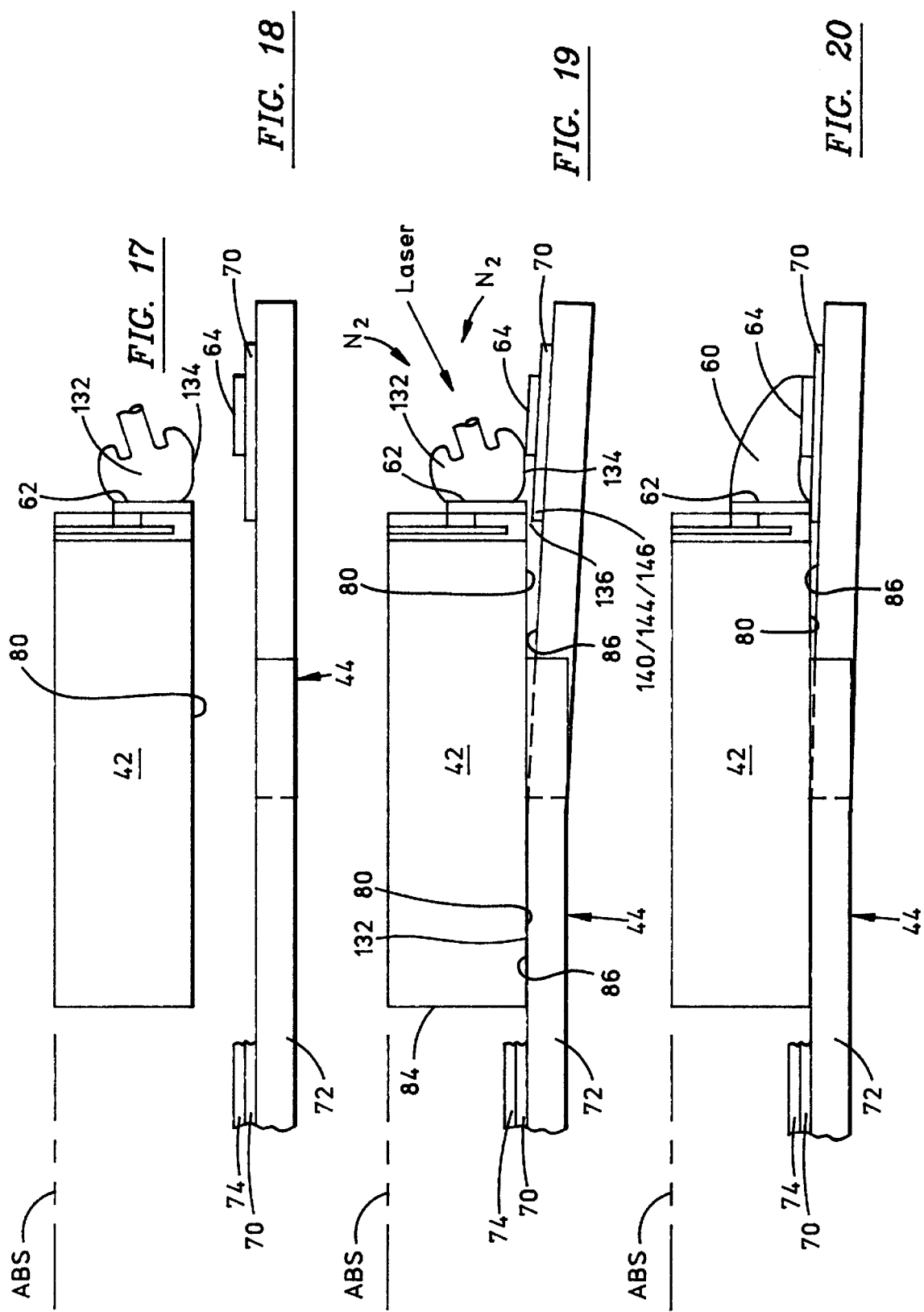

METHOD OF ELECTRICAL CONNECTION BETWEEN HEAD TRANSDUCER AND SUSPENSION BY SOLDER WIRE BUMPING AT SLIDER LEVEL AND LASER REFLOW

CROSS REFERENCE TO RELATED PATENTS

1. Commonly assigned U.S. Pat. No. 5,530,604 for "Transducer Head Solder Connection";

2. Commonly assigned U.S. Pat. No. 4,996,623 for "Laminated Suspension for a Negative Pressure Slider in a Data Recording Disk File";

3. Commonly assigned U.S. Pat. No. 4,761,699 for "Slider-Suspension Assembly and Method for Attaching a Slider to a Suspension in a Data Recording Disk File";

4. Commonly assigned U.S. Pat. No. 4,970,365 for "Method and Apparatus for Bonding Components Leads to Pads Located on a Non-Rigid Substrate"; and 5. Commonly assigned U.S. Pat. No. 5,298,715 for "Lasersonic Soldering of Fine Insulated Wires to Heat-Sensitive Substrates".

The above patents are incorporated by reference herein.

BACKGROUND OF THE INVENTION

1. Field of the Invention

The present invention relates to slider-suspension assemblies for data recording information storage systems and to a method for making such assemblies. In particular the invention relates to a method of electrical interconnection between the read/write head transducers and the suspension leads by solder bumping the pads at the slider level followed by a laser reflow.

2. Description of the Related Art

A magnetic disk drive rotates a magnetic disk adjacent a magnetic head which is mounted on a slider. The slider is supported by a suspension connected to an actuator that positions the magnetic head over selected information tracks on the disk. Such a slider-suspension assembly is also known as a head gimbal assembly. The suspension loads the slider on the disk with a force which is counterbalanced by an air bearing between the disk and an air bearing surface (ABS) of the slider. A typical suspension has a metallic flexure attached to a metallic load beam. The suspension allows the slider to pitch and roll with respect to the disk while applying the loading force toward the disk. The slider is mounted to the flexure portion of the suspension and has exposed electrical pads connected to components of the magnetic head. Discrete electrical wires, which extend from the read/write electronics, are connected to the head termination pads on the slider for conducting signals to and from the magnetic head.

More recently, suspensions with integrated electrical conductors in the flexure member have been built from laminated structures which are fully described in the aforementioned U.S. Pat. No. 4,996,623. Such suspensions are henceforth referred to as integrated suspensions. The laminated structure includes a polyimide layer sandwiched between a steel layer and a copper layer. The copper layer is etched to provide leads which terminate at suspension pads and the steel layer provides the supporting structure. The leads take the place of the aforementioned discrete electrical wires. The slider pads are then connected to the suspension pads by various methods.

One method of connecting a slider pad to a suspension lead pad is described in the cross-referenced U.S. Pat. No. 5,530,604. A solder bump is provided on each slider pad at the wafer level, and a solder bump is provided on each suspension lead pad. The slider is then attached to the suspension by adhesive bonding and the two solder bumps are reflowed to form the electrical interconnection by a laser beam. Typically there are several thousands of sliders on a wafer. Solder is applied to slider pads by screen printing solder paste through a mask and reflowing the paste to form solder bumps. The wafer is then subjected to a slider fabrication process which consists of dicing the wafer into rows, creating the air bearing surface (ABS), and then further dicing into discrete sliders (slider level). During the slider fabrication process the rows are bonded to fixtures for processing and after dicing they are debonded by heat and solvents. The rows are also lapped with a grinding slurry and then subjected to dry etching processes to create the aforementioned ABS. Cleaning processes which consist of blasting with abrasive slurry (as used in dental cleaning) are also employed to remove adhesives and photoresist. It has been observed that all the aforementioned bonding, debonding, lapping and cleaning processes seriously damage the solder bumps by oxidation and erosion leading to problems in forming the interconnection. The present invention is an improvement of the process in U.S. Pat. No. 5,530,604 by implementing novel and unique solder connections between slider pads and suspension pads at the slider level.

In European Patent application (EPA) No. 94119622.2, published Sep. 13, 1995 under No. 0 671 727 A1, a slider pad is connected to a suspension pad by gold ball bonding. The EPA does not employ laser reflow. In U.S. Pat. No. 4,761,699 a slider pad is connected to a suspension pad by solder reflow. Solder bumps are constructed on the slider pads at the wafer level and a laser is not employed for reflow. In U.S. Pat. No. 5,298,715 wires are connected between slider pads and suspension pads by solder bonding. The solder bonding is implemented by simultaneous ultra-sonic bonding and laser heating. In U.S. Pat. No. 4,970,365 leads are connected to circuit boards by gold bonding. The gold bonding is implemented by simultaneous ultra-sonic bonding and laser heating. There is a strong felt need for a solder connection between a slider pad and a suspension pad which can be made at the slider level with the same integrity as the connection made in U.S. Pat. No. 5,530,604.

SUMMARY OF THE INVENTION

The present invention is an improvement of the cross-referenced U.S. Patent by overcoming degradation of the solder bumps created at the wafer level. This is accomplished by various methods of solder wire bumping at the slider or row level. However, the first object of the head gimbal assembly is very precise alignment of the load applying gimble feature to the centroid of the air bearing surface. Therefore, specific tolerance conditions within the integrated suspension itself, and the manufacturing tooling for attaching the slider to the suspension, cause the suspension termination pads to have a misalignment tolerance with respect to the slider solder bumps. This misalignment is in the plane of the suspension. There can be a further misalignment of the four solder bumps that is normal to the suspension. This is because the solder wire bumping processes also have limitations in the degree of accuracy that all the solder bumps can be placed with respect to the slider surface to which the suspension is attached. The present invention teaches both conventional and new solder wire bumping processes that have optimal solder geometries for overcoming these limitations and effecting a reliable electrical joint. It further teaches to use these solder bump geometries in combination with integrated suspension designs that incorporate planar geometric features in the area of the termination pads such that all the suspension pads are aligned and in contact, or are in very close proximity to the slider solder bumps. In the preferred embodiments, the slider with solder bumps is first fixed to the suspension, and then electrical interconnection is established by reflowing these bumps.

In one method a solder wire bump is formed on a slider pad which has a tail and the suspension pad has a flattened solder bump. Electrical interconnection is established by reflowing these bumps. Reflow is accomplished by a laser beam which makes a superior connection. The reliability of the solder reflow process can be further enhanced by the integrated suspension previously described that has the required geometric features to bring the respective slider and suspension solder bumps into closer physical proximity in the pre-reflow condition.

In another method, the slider pad is bumped at an angle with the tail of the solder bump angling away from the ABS while the solder bump on the suspension pad is omitted. The angled solder pad on the slider pad is then heated by the laser beam which causes reflow. Again, that portion of the suspension carrying the termination pads can have geometric features that enhance the ability of the tails on all four solder bumps to be in contact or close proximity to the suspension pads in the pre-reflow state.

In still another method, the slider is affixed to a tool which has a surface to which solder will not stick. The slider pad and the surfaces of the tool are then solder bumped by a common solder wire ball to effect a solder bump geometry that is more colinear with the suspension attach surface of the slider, and where the bumps extend further beyond the slider head termination pads at this interface. As in the above methods, when the slider is affixed to the suspension, the suspension can have a geometric feature that provides a low normal bias force of the suspension pads against the slider solder bumps. The solder bump is then heated by the laser beam for reflow.

In all these methods the slider pad is preferably bumped at the slider level and reflow is implemented by a laser beam to provide a superior connection between the slider pad and suspension pad. It should be understood, however, that in another embodiment of this invention, the slider pads may be bumped at the row level after the air bearing surface has been created and just prior to dicing into sliders. At this stage the solder bumps are not subject to the aforementioned harsh processing steps.

A still further method affixes the slider to the suspension before any solder wire bumping. The slider pad and the suspension pad are then bumped by a common solder wire ball. The common solder wire bump is then heated by the laser beam for reflow. This process requires a suspension loadbeam with geometric features such that both the slider and the integrated suspension area carrying the termination pads can have adequate mechanical support by the bumping process tooling, whereas in the previous described processes no such features are required because essentially no external force is required in the process after the slider is attached to the suspension.

An object is to overcome the problem of degradation of solder bumps applied at the wafer level in U.S. Pat. No. 5,530,604.

Another object is to provide a method of making a solder connection between a slider pad and a suspension pad where, upon reflow, a solder bump on the slider pad will reconfigure by surface tension to contact a solder bump on the suspension pad.

A further object is to provide a method of making a solder connection between a slider pad and a suspension pad where, upon reflow, a solder bump on the slider pad will contact and connect with the suspension pad.

Still a further object is to provide geometric features in the termination pad region of the suspension such that all the suspension pads want to be biased in contact, or in very close proximity to all solder bumps on the slider, where upon laser reflow, all bumps will more reliably interconnect with all suspension pads.

Still another object is to provide a method of making a solder connection between a slider pad and a suspension pad where a solder bump is formed at the corner of the slider pad and a non-stick surface of a tool, the slider is removed from the tool and affixed to the suspension with the suspension pads biased against the solder bump and the solder bump is then heated by a laser beam for reflow.

Still a further object is to provide a method of making a solder connection between a slider pad and a suspension pad where the slider is affixed to the suspension and then a common solder bump is formed at the corner of the slider pad and the suspension pad followed by reflow.

Other objects and advantages of the invention will become apparent upon reading the following description taken together with the accompanying drawings.

BRIEF DESCRIPTION OF THE DRAWINGS

FIGS. 6A–6D show a series of steps for producing a solder bump with a tail on a slider pad using solder wire.

FIG. 11A shows a side view of the slider wherein the slider pad is bumped with a solder ball, the solder ball having a tail which is angled away from the ABS.

FIG. 11B shows the solder bump being heated by a laser for reflow after the slider is attached to the suspension.

FIG. 11C shows the right angled fillet joint after reflow making a connection between the slider pad and the suspension pad.

FIG. 13 is a partial side view of the slider and a cut-away portion of a tool, wherein the slider pad and the surface are bumped with a solder bump angled at 90° to the slider pad.

FIG. 14 is a view taken along plane XIV—XIV of FIG. 13.

FIG. 15 is similar to FIG. 13 except the solder ball is bumped at an angle of 45° to the slider pad, and the tool has a non-stick surface that extends far beyond the slider trailing edge.

FIG. 16 is a view taken along plane XVI—XVI of FIG. 15.

FIG. 17 is a side view of the slider with the solder bump bumped at 45° as shown in FIG. 15.

FIG. 18 shows a side view of the integrated suspension with copper and polyimide layers removed at selected locations.

FIG. 19 shows the slider affixed to the suspension with the slider pad spring biased against the solder ball and heat being applied by a laser for reflow.

FIG. 20 shows the connection of the slider pad to suspension pad after reflow.

DETAILED DESCRIPTION OF THE PREFERRED EMBODIMENTS

Figure 1:
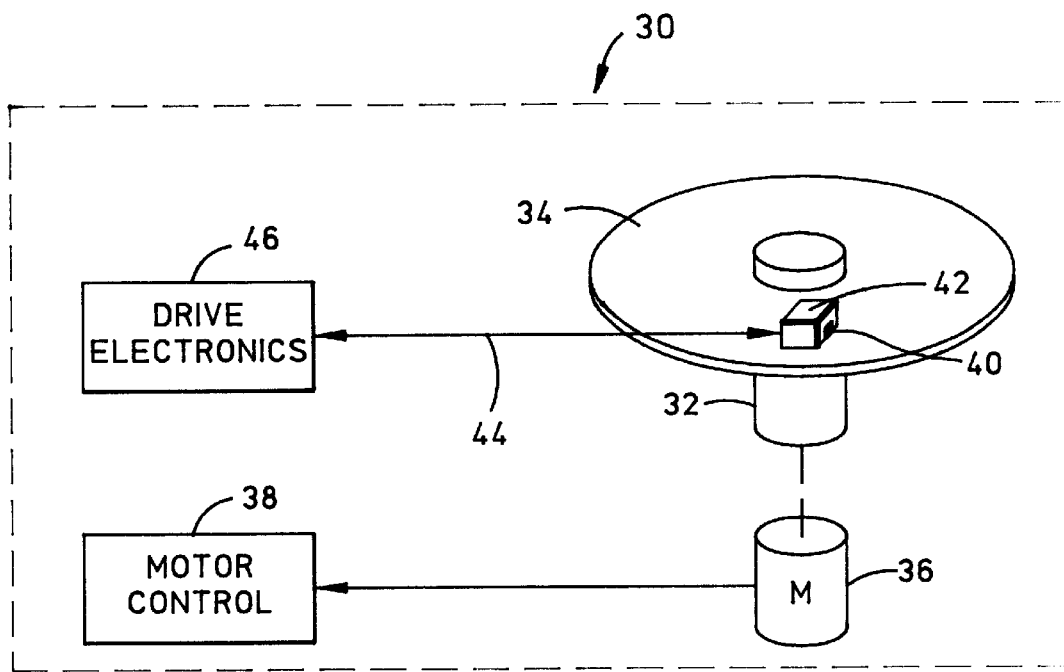
FIG. 1 is an isometric schematic illustration of an exemplary disk drive employing a slider of the present invention.

Referring now to the drawings wherein like reference numerals designate like or similar parts throughout the several views, there is illustrated in FIG. 1 a disk drive 30. The disk drive 30 includes a spindle 32 which supports and rotates at least one magnetic disk 34. The spindle 32 is rotated by a motor 36 which is governed by motor control 38. A thin film magnetic head 40 of the present invention is mounted on a slider 42, the slider being supported by a suspension and actuator arm 44. The suspension and actuator arm 44 positions the slider 42 so that the head 40 is in a transducing relationship with a surface of the magnetic disk 34. When the disk 34 is rotated by the motor 36, air is moved by the surface of the disk, causing an air bearing surface (ABS) of the slider to ride on an air bearing slightly off the surface of the disk. The head 40 is then employed for writing information to multiple circular tracks on the surface of the disk 34, as well as reading information therefrom. These information signals, as well as servo signals for moving the slider to various tracks, are processed by drive electronics 46.

Figure 2:
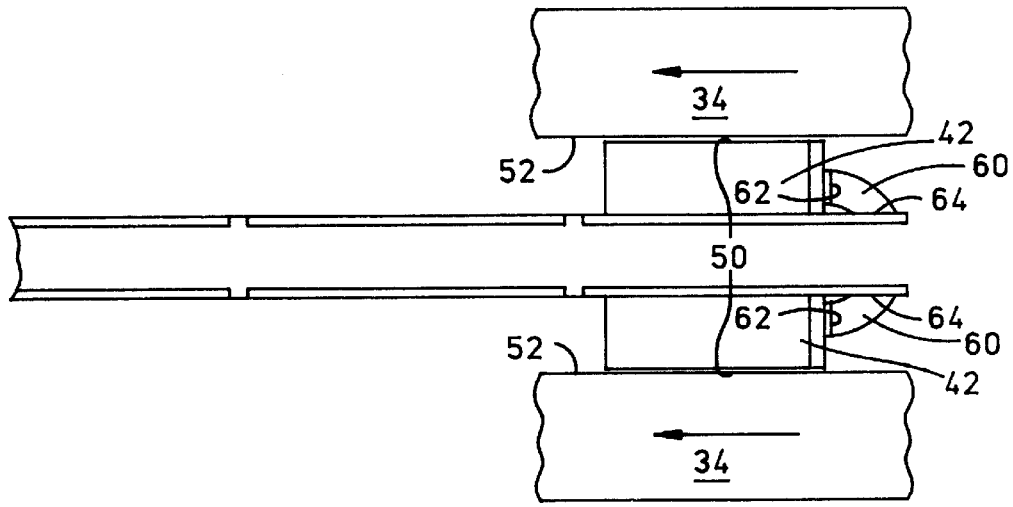
FIG. 2 illustrates a pair of integrated suspensions loading a pair of sliders on a pair of rotating disks.
Figure 3:
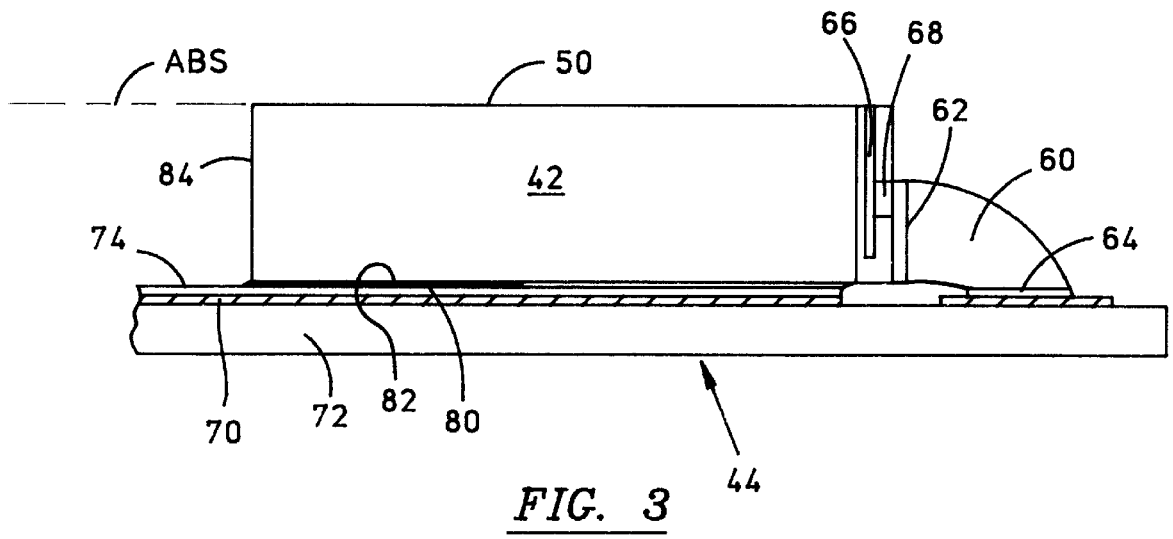
FIG. 3 is a side view of the integrated suspension and the slider showing a solder connection between a slider pad and a suspension pad.
Figure 4:
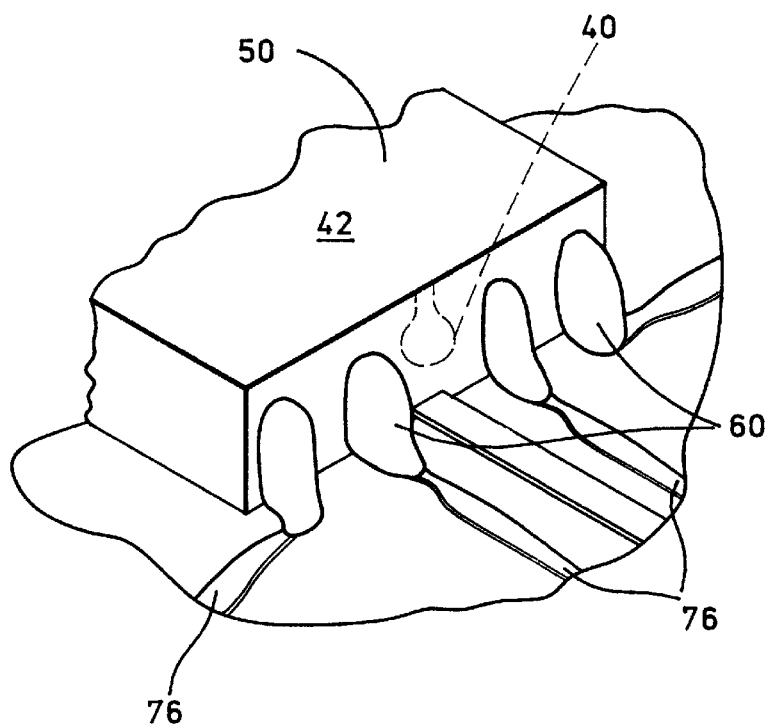
FIG. 4 is an isometric illustration of solder connections between slider pads and suspension pads.

FIG. 2 shows schematically a pair of the sliders 42 on a pair of the disks 34 by a pair of the suspensions 44 when the disks are rotating. It also shows the loading force of the sliders 42 counterbalanced by an air bearing between air bearing surfaces 50 and surfaces 52 of the disks. Solder connections 60 interconnect slider pads 62 to suspension pads 64. As shown in FIG. 3 the slider pad 62 is connected to a component 66 of the magnetic head by a conductive via 68. As shown in FIG. 4 the slider 34 may have four slider pads 62 which are connected to four suspension pads 64 by the solder connections 60.

Figure 21A:
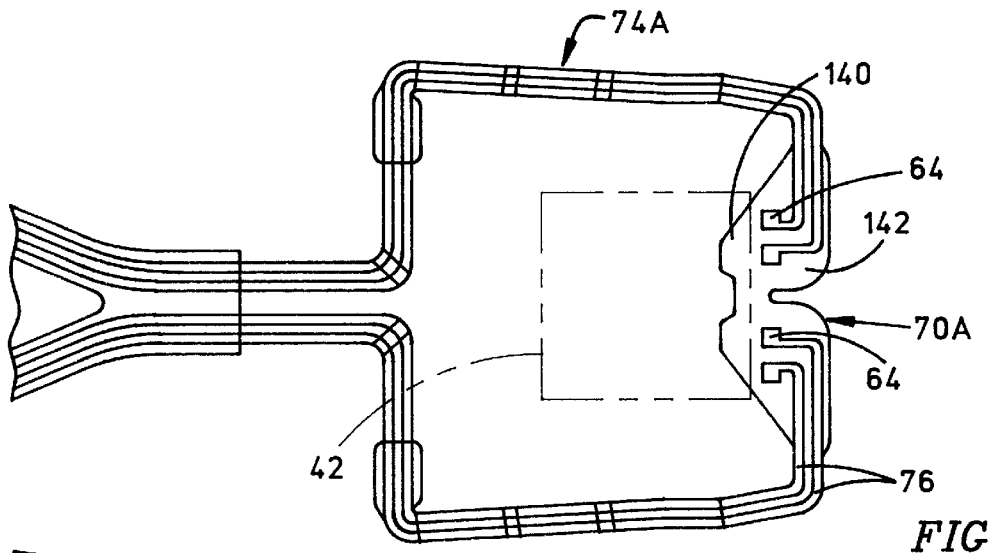
FIG. 21A shows only two layers of a first embodiment of a three layer laminated suspension wherein the two layers are a copper layer on a polyimide layer with the copper layer formed into leads.
Figure 21B:
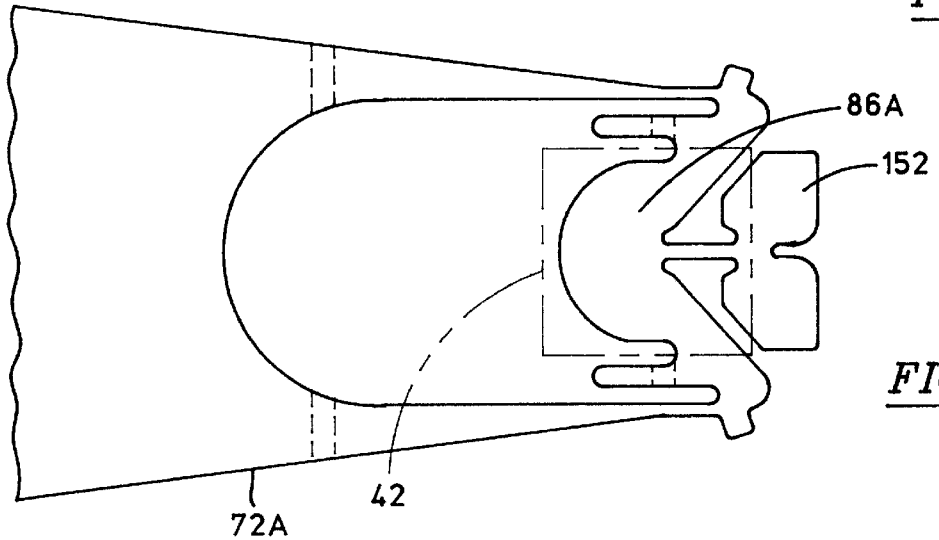
FIG. 21B shows only the stainless steel support layer of the first embodiment of the three layer laminated suspension.
Figure 21C:
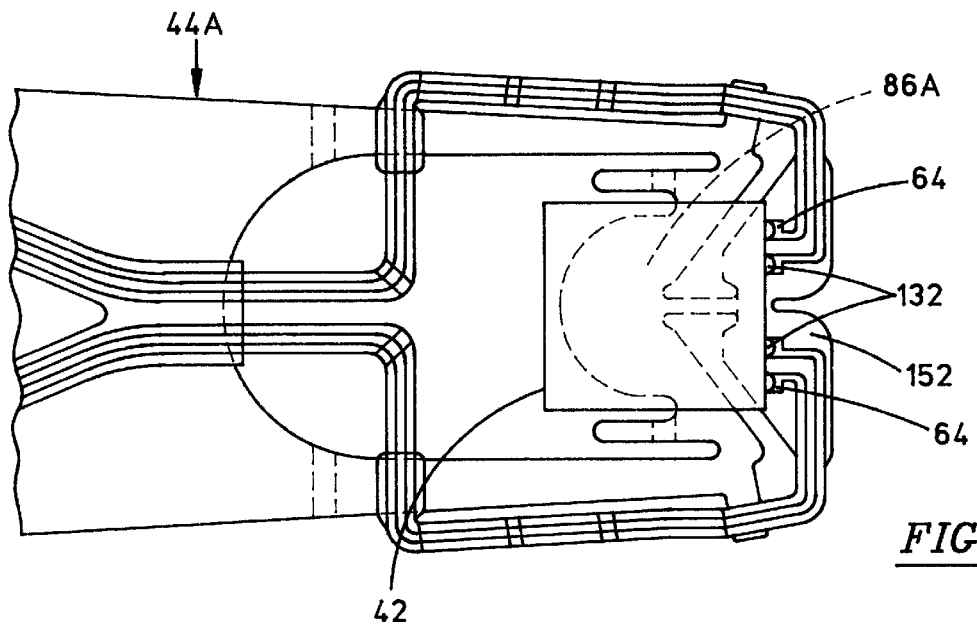
FIG. 21C shows all three layers of the first embodiment of the laminated suspension with a slider affixed to the stainless steel layer of the suspension.
Figure 22A:
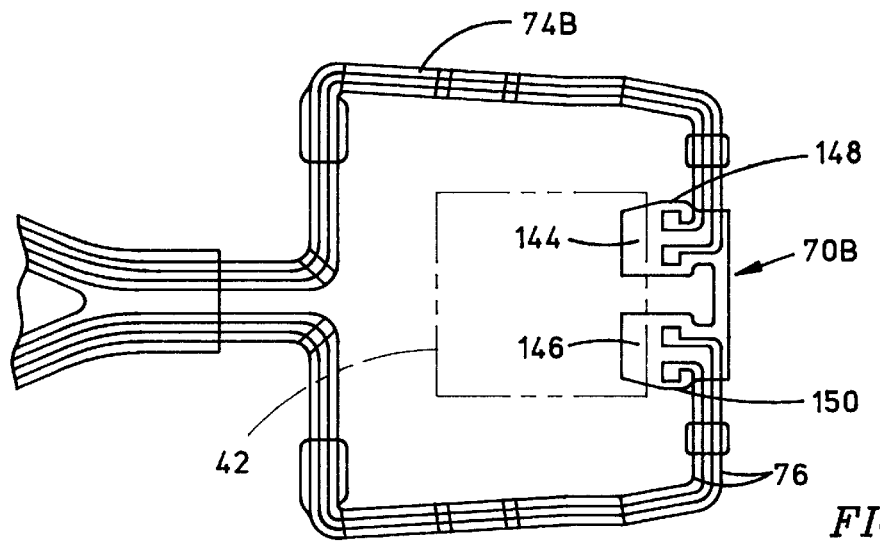
FIG. 22A shows only two layers of a second embodiment of a three layer laminated suspension wherein the two layers are a copper layer on a polyimide layer with the copper layer formed into leads.
Figure 22B:
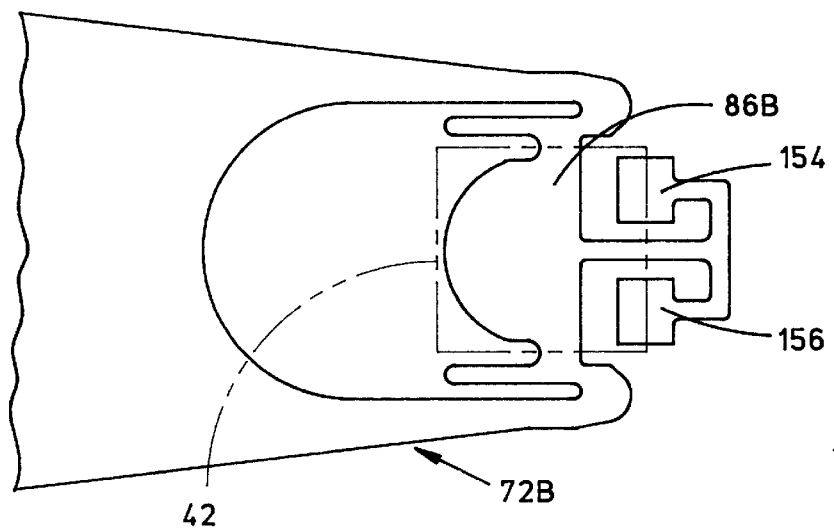
FIG. 22B shows only the stainless steel support layer of the second embodiment of the three layer laminated suspension.
Figure 22C:
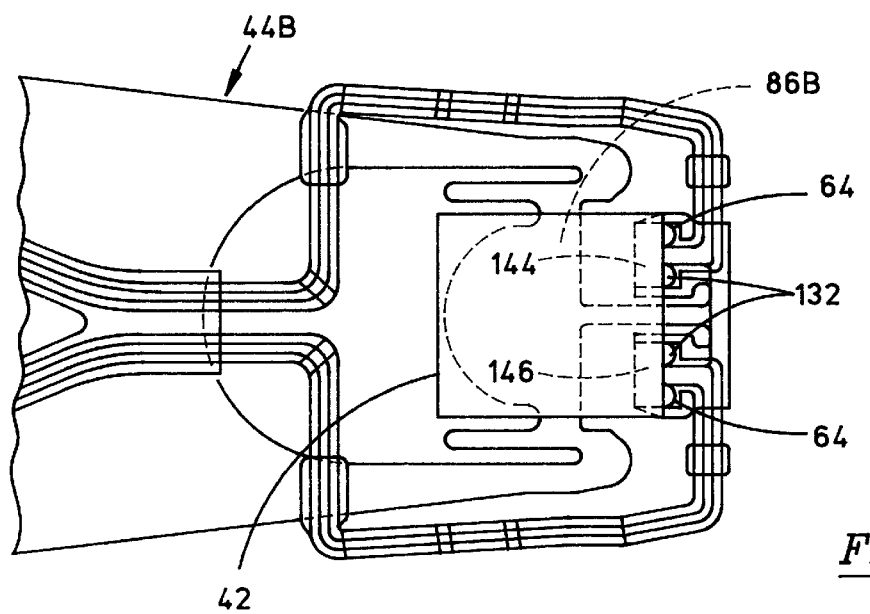
FIG. 22C shows all three layers of the second embodiment of the laminated suspension with a slider affixed to the stainless steel layer of the suspension.

A first pair of the slider pads may be connected to a coil (not shown) in a write head and a second pair of the slider pads may be connected to a magnetoresistive (MR) sensor (not shown) of a read head. As shown in FIG. 3 the suspension may be a laminated or integrated suspension which includes an insulative layer, such as a polyimide layer 70, sandwiched between a steel layer 72 and a copper layer 74. As shown in FIG. 4 the copper layer is selectively etched to provide copper leads 76 which terminate at the suspension pads 64 (see FIG. 3). As shown in FIG. 3, the slider 42 is affixed to the suspension 44 by bonding a surface 80, opposite the ABS 50, to a surface 82 of the integrated suspension using an adhesive so that the slider has a leading edge 84 with respect to rotation of the disk 34 in the drive. In the embodiment shown in FIG. 3 this bonding occurs between the surface 80 and a copper island on the suspension. This copper island may be formed by the same etching process which forms the copper leads 76. Another arrangement for affixing the slider to the suspension 44 is shown in FIGS. 19, 20, 21 C and 22C, wherein the suspension area that is adhesively attached to the slider, the polyimide and copper layer has been removed so that the slider adhesive bond is directly to the stainless layer. In this type process, the suspension is designed to have the electrical path to the termination pads route around the periphery of the slider as shown in FIGS. 21C and 22C. The suspension area that contains the pads and the regions leading thereto can incorporate geometric features to enhance the ability of the suspension pads to be biased in contact, or in very close proximity to the slider solder bumps.

Figure 5A:
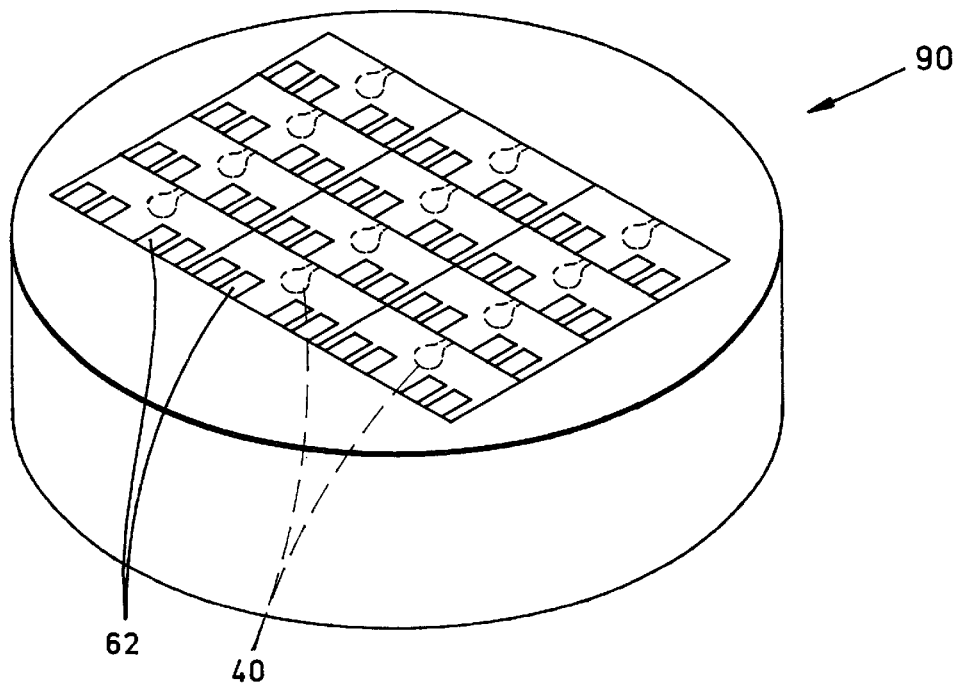
FIG. 5A is an isometric illustration of rows and columns of sliders at the wafer level.

As shown in FIG. 5A rows and columns of sliders 42 are fabricated on a substrate 90 at the wafer level. In prior practice solder bumps were formed on the slider pads 62 at the wafer level. This was accomplished by screen printing solder paste through a mask on solder pads and then reflowing the solder paste to produce solder bumps on the slider pads 62. Subsequent to forming solder bumps the wafer 90 was subjected to a slider fabrication process which consists of dicing the wafer into rows, creating the air bearing surface and then further dicing the rows to discrete sliders. The aforementioned processing steps at the wafer and row levels caused oxidation and erosion of the solder bumps on the slider pads. The present invention provides methods of forming bumps on the slider pads 62 subsequent to the wafer level 90.

FIGS. 6A–6D schematically illustrate various steps in the process of solder bump formation using solder wire. A commercially available wire bonder (for example, K & S model 4124, Shinkawa model SBB-1) is used for this purpose. The solder wire of diameter 25 $\mu$m to 50 $\mu$m is commercially available from Tanaka Denshi Kogyo in Japan. A solder wire 104 is inserted through a ceramic capillary 102 of suitable diameter as shown in FIG. 6A. A solder ball 108 is formed at the bottom of the capillary by an arc discharge between an electrode 106 and the wire in Ar+4–10% hydrogen gas, as shown in FIG. 6B. The ball 108 is then bonded to the slider pad 62 by pressing the ball against the pad with the bottom end 110 of capillary 102, and employing ultrasonic power while the slider is heated to approximately 140°–150° C., as shown in FIG. 6C. After the ball is bonded, the capillary is raised, while the wire is clamped by a clamp 111 above the capillary and pulled. The wire breaks above the neck of the ball, leaving a solder bump 94 with a tail 100, as shown in FIG. 6D. The cycle is repeated with ball formation by arc discharge. The slider pads may or may not extend all the way to the suspension attach surface of the slider. Similarly for a very small slider, such as the industry describes as 30%, where the width of the slider is on the order of 1.0 mm, the pitch between pad pairs is on the order of 110 microns. This limits the maximum diameter of the ball and there the distance the solder bump can extend beyond the slider pad to accommodate misalignment of the suspension pads in this direction. All these steps are carried out automatically in commercial wire bonders with bumping capabilities.

Figure 5B:
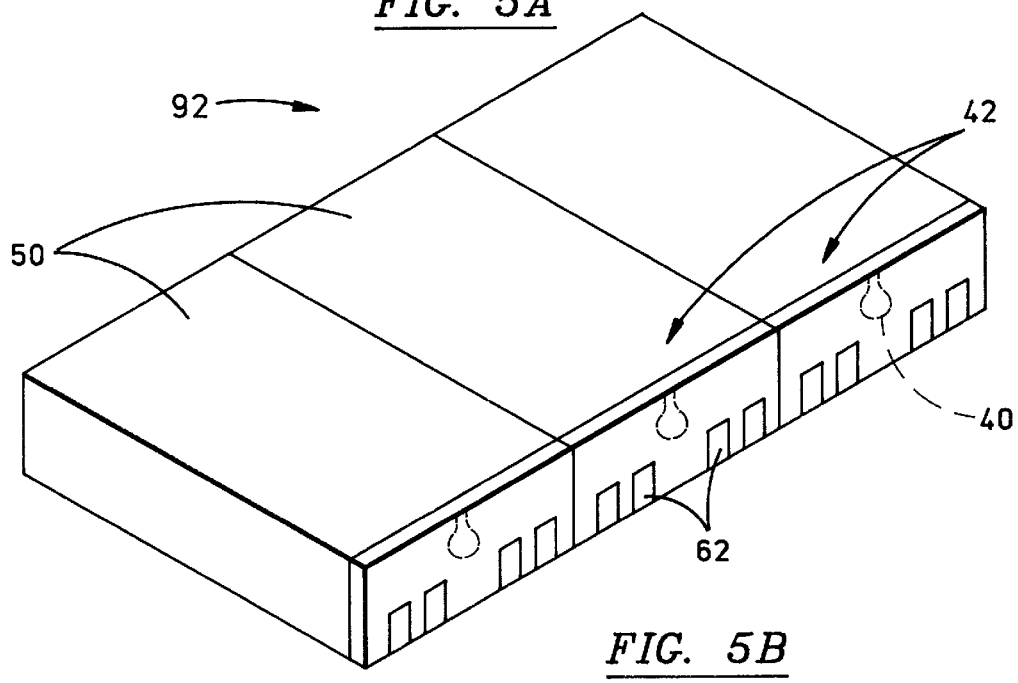
FIG. 5B is an isometric illustration of sliders at the row level.
Figure 7A:
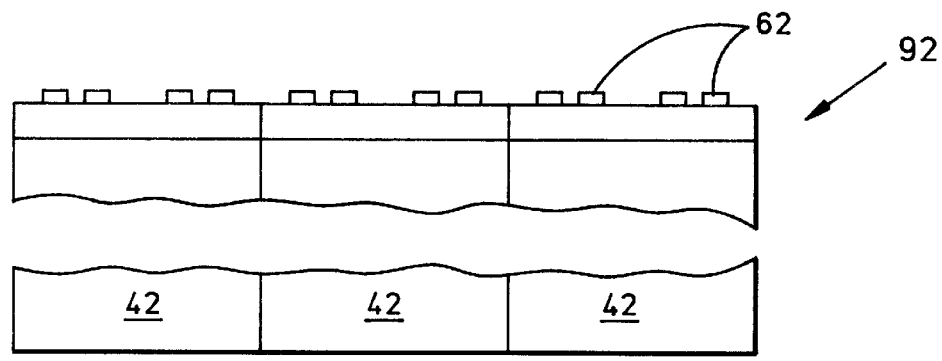
FIG. 7A is a side view of a row of sliders with slider pads.
Figure 7B:
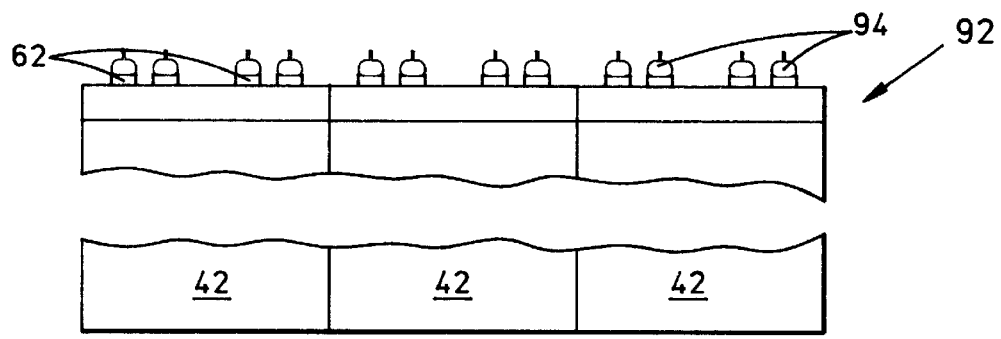
FIG. 7B is the same as FIG. 7A except that the slider pads have solder wire bumps.

FIGS. 5B and 7A show the sliders 42 at the row level 92 before the slider pads 62 are solder bumped. FIG. 7B shows the sliders 42 after solder bump 94 formation on the slider pads 62. The row of sliders 92 can then be diced to provide individual sliders at a slider level 96 as shown in FIG. 8B.

Figure 8A:
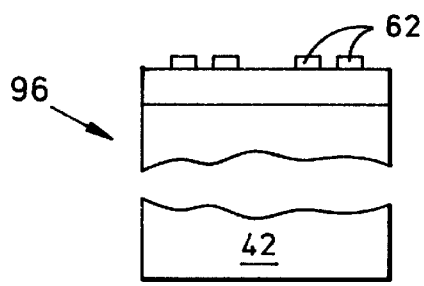
FIG. 8A is a side view of an individual slider at the slider level with slider pads.
Figure 8B:
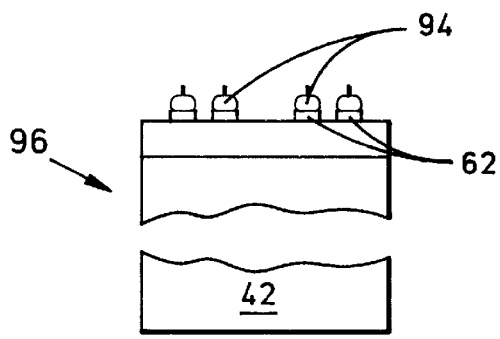
FIG. 8B is the same as FIG. 8A except the slider pads have solder wire bumps.
Figure 9A:
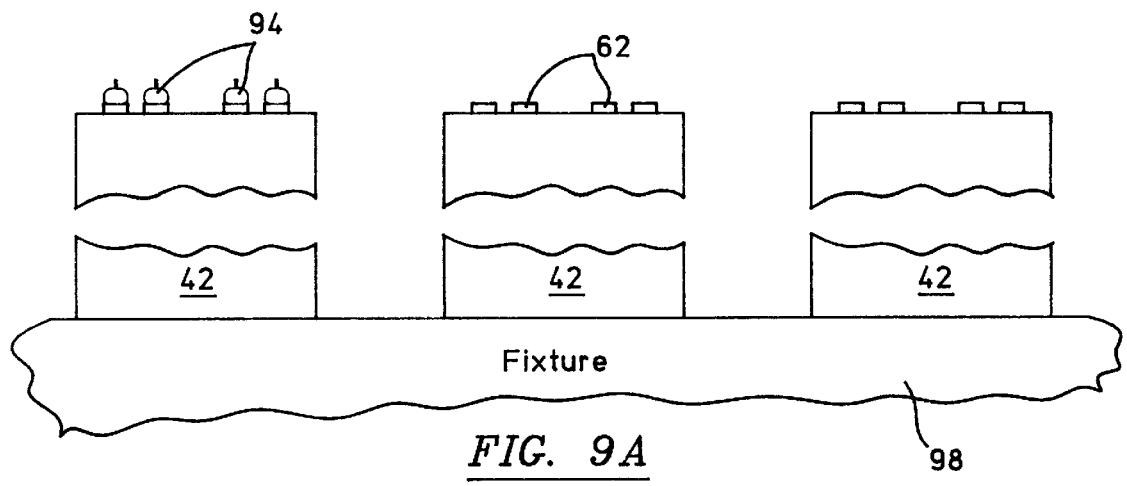
FIG. 9A is a plurality of sliders mounted on a fixture for solder bumping.
Figure 9B:
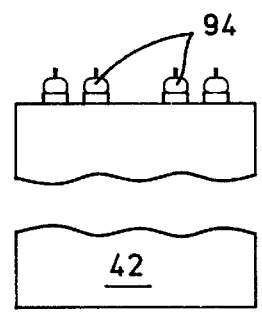
FIG. 9B is one of the sliders of FIG. 9A after separation from the fixture with solder bumps on the slider pads.

In the preferred embodiment the sliders 42 are diced into individual sliders at the slider level 96 as shown in FIG. 8A. Solder bumps 94 are then formed on the slider pads 62 using solder wire bumping as shown in FIG. 8B. Alternatively, the sliders 42 at the slider level 96 may be affixed to a fixture 98 where the slider pads 62 may be solder bumped to provide bumps 94. The sliders 42 are then released from the fixture to provide a released slider as shown in FIG. 9B.

From FIG. 6D it should be noted that the tail 100 extends substantially perpendicular to a flat surface of the slider pad 62. The solder wire bumping shown in FIG. 6D is at 90° to the surface of the slider pad 62 which is considered normal practice. If the slider pad is presented at an angle to the capillary other than 90° this is called angular bumping which is at some angle to the perpendicular. This process can create a solder bump tail or solder bump top surface that extends further beyond the trailing edge of the slider to better accommodate misalignment of the suspension pad to the solder bump in this direction which is typically on the order of ±30 microns to ±40 microns.

Figure 10A:
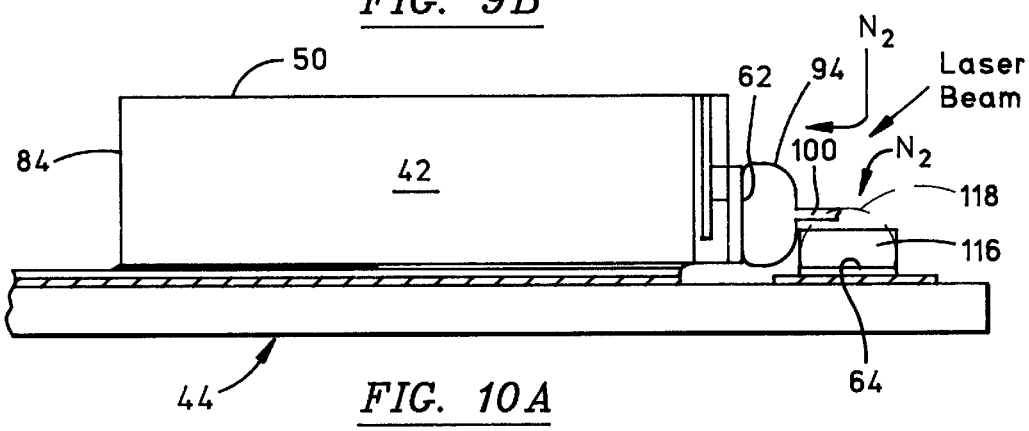
FIG. 10A shows a laser beam applying heat to reflow the solder bumps after the slider is affixed to the suspension.

A flat solder bump 116 on the suspension pad 64, as shown in FIG. 10A, can be produced easily and economically by either screenprinting solder paste through a mask, reflowing the solder and flattening by a die, or by a selective solder plating process. Such a flat bump can also be produced from solder wire bumping and flattening the tail by mechanical means.

Figure 10B:
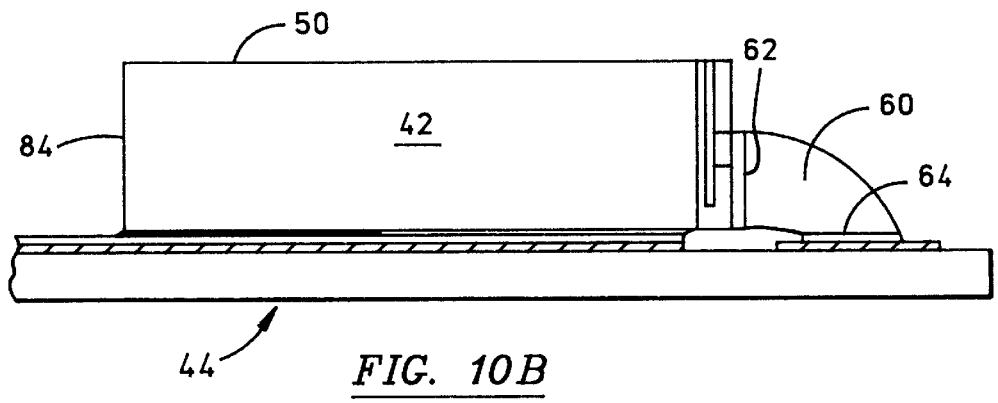
Fig. 10B shows a right angled fillet joint after reflow making a solder connection between the slider pad and the suspension pad.

In FIG. 10A the slider 42 is affixed to the suspension 44 as described hereinabove. This affixing positions the tail 100 over and adjacent the flattened solder bump 116. Upon reflow the flattened solder bump 116 has an expected reconfiguration due to surface tension which will form a substantially spherical shape as shown by the phantom line at 118. The tail 100 projects within this expected expansion which will cause the solder bumps 94 and 116 to effectively unite and cause an efficient reflow therebetween. As shown in FIG. 10A the solder bumps 94 and 116 are reflowed by the laser beam under an inert gas atmosphere like nitrogen gas which produces the solder connection 60 between the slider pad 62 to the suspension pad 64, as shown in FIG. 10B.

Another embodiment of the invention is illustrated in FIGS. 11A–11C. In FIG. 11A the slider pad 62 is solder wire bumped at an angle to produce a solder bump 120 which has a tail 100 which is directed at an angle away from the ABS 50 instead of being parallel thereto as shown in FIG. 6D. The same tool described hereinabove can be employed for producing the solder bump 120. Essentially the steps shown in FIG. 6A–6D will be employed except the capillary tube is directed at an angle from a normal to the slider pad 62. When the slider 42 is affixed to the suspension 44, as shown in FIG. 11B, the tail 100 is directed downwardly toward the suspension pad 64. The tail length is controlled so that the tail is in contact with slider pad 62 on assembly. Upon heating by a laser beam under an inert gas atmosphere, like nitrogen, the solder bump 120 is reflowed to produce the solder connection 60 between the slider pad 62 and the suspension pad 64 as shown in FIG. 11C.

FIGS. 13–20 illustrate another embodiment of the present invention. As shown in FIGS. 15 and 16 the slider 42 is affixed to a tool 124 which has a surface 126 which will not stick to solder. The tool 124 may be made of glass or some other ceramic. In FIGS. 13 and 14 the slider pad 62 is bumped at 90° with a solder bump 130. The solder bump 130 may be constructed with the aforementioned tool. FIGS. 15 and 16 are similar to FIGS. 13 and 14 except the slider pad 62 has been bumped with a solder bump 132 which is implemented by angled bumping. The angled bumping is preferred over the 90° bumping shown in FIGS. 13 and 14. A preferred angle is in the range of 45° to 60° to either of the flat surfaces of the slider pad 62 or the surface 126 of the tool. It should be noted that in practice the tool 124 with the slider 42 in FIGS. 13 and 15 will be angled at the desired angle for bumping with the wire bumping being directed vertically downward by the aforementioned solder wire bumping tool.

FIG. 17 shows the slider 42 after removal from the tool 124 leaving the angled solder ball 132 with a flattened portion 134. FIG. 18 shows the suspension 44 with selected portions of the copper layer 74 and the polyimide layer removed. As shown in FIG. 19 the slider 42 is connected to the suspension 44 by bonding the slider surface 82 to a portion of a surface 86 of the steel layer 72 instead of the copper island shown in FIG. 4. This is accomplished by removing portions of the polyimide layer 70 and the copper layer 74 between the suspension pad 64 and a location spaced from a leading edge 84 of the slider toward an actuator (not shown) to the left in the drawing. The spring force of the steel layer 72 spring biases the suspension pad 64 against the flattened portion 134 of the solder ball 132. This provides good engagement between the slider pad 44 and the solder ball 132. As shown in FIG. 19, in the area of the termination pads, the polyimide layer 70 extends toward the leading edge 84 of the slider so as to be located between the surface 86 of the steel layer 72 and the side 80 of the slider. The engagement of the suspension pad 64 with the flattened portion 134 of the solder ball 132 leaves a slight space 136 between the side 80 and the polyimide layer 70. As shown in FIG. 19, the solder bump 132 is then heated by the laser beam in the inert gas cover which causes reflow of the bump to produce the solder connection between the slider pad 62 and the suspension pad 64 as shown in FIG. 20. Upon reflow the space 136 in FIG. 19 is closed and the polyimide layer 70 engages the side 80 of the slider so that the flat surface of the pad 64 is located between the planes of the slider surface 80 and the ABS.

It should be noted that the above described methods are typically employed for solder connecting first and second pairs of slider pads on the slider 42 to first and second pairs of suspension pads on the suspension 44. This is shown in FIG. 4. With this implementation first and second pairs of solder bumps 132, like the solder bump 132 in FIGS. 18 and 19, are reflowed to make connections of the first and second pairs of the slider pads 62 with the first and second pairs of suspension pads 64 respectively. This is more completely shown in FIGS. 21A–21C which is one embodiment 44A of the suspension and in FIGS. 22A–22C which is another embodiment 44B of the suspension. Each of FIGS. 21A and 22A show only the copper layer 74A and 74B respectively on the polyimide layer 70A and 70B respectively with the copper layer formed into leads 76. The slider 42 is shown in phantom with its slider pads (not shown) adjacent the first and second pairs of suspension pads 64. In FIGS. 21B and 22B only the stainless steel layer 72A and 72B respectively is shown with the slider 42 in phantom. As shown, the slider 42 will be affixed to surface portions 86A and 86B respectively of the stainless steel layers 72A and 72B respectively. In FIGS. 21A and 22B the laminated suspensions 44A and 44B are shown complete with all three layers and with the slider 42 attached to the aforementioned portions 86A and 86B respectively.

As shown in FIGS. 19, 21A and 21C a portion 140 of a single component 142 of the polyimide layer 70A is disposed between the surface 80 of the slider and the surface 86A of the steel layer. This portion 140 is spaced from the surface 80 of the slider by the aforementioned space 136 as shown in FIG. 19. After reflow, as shown in FIG. 20, the suspension 44 collapses against the slider 42 closing the space 136 so that the surface 80 of the slider engages the surface of the polyimide portion 140. FIGS. 19, 22A and 22C show portions 144 and 146 of first and second components 148 and 150 of the polyimide layer 70B disposed between the surface 80 of the slider and the surface 86B of the steel layer with the portions 144 and 146 spaced from the surface 80 of the slider by the space 136 as shown in FIG. 19. Again, after reflow, as shown in FIG. 20, the suspension 44 collapses against the slider surface 80 closing the space 136 so that the slider surface 80 engages the surfaces of the polyimide portions 144 and 146. Advantages of these steps will be described hereinbelow.

The major difference between the first and second embodiments of the laminated suspensions shown in FIGS. 21A–21C and 22A–22C respectively is that in the first embodiment the stainless steel layer 72A has a single component 152 which biases both of the first and second pairs of suspension pads 64 toward the solder bumps 132, as shown in FIG. 21C, whereas in the second embodiment the stainless steel layer 72B has first and second components 154 and 156 which bias the first and second pairs of suspension pads 64 respectively toward the first and second pairs of the solder bumps 132. Accordingly, in FIG. 21C the single component 152 will not engage all of the suspension pads 64 with all of the solder bumps 132. If any one of the solder bumps is out of level with respect to the other three bumps. Engagement with all of the bumps will occur only if the flattened portions 134 of the bumps are at the same level. However, in the embodiment shown in FIGS. 22A–22C the first component 154 biases only the first pair of suspension pads 64 into engagement with the first pair solder bumps 132 and the second component 156 biases only the second pair of suspension pads 64 into engagement with the second pair of solder bumps 132. Accordingly, with the second embodiment all of the suspension pads 64 will make engagement with the all of the solder bumps 132.

It should be noted that when the solder bump 132 is reflowed, it will tend to expand and contact the suspension pad 64 even if there is a minor gap between the suspension pad 64 and the solder bump. The reflow process in FIG. 19 may be employed for individual pads, or simultaneously for all four bumps at once, so the deflected suspension 44 in FIG. 19 collapses to make the polyimide layer 70 contact the surface 80 of the slider, as shown in FIG. 20. In this manner, the suspension has a very known final displacement that is equal to the thickness of the polyimide layer 70 which is about 18μm. This small displacement results in a very repeatable strain condition in the rest of the suspension, thereby guaranteeing pitch and roll stability of the suspension.

It should also be noted that the process in FIG. 19 requires no external force be applied to the slider 42 to do the suspension adhesive attachment before reflow or the subsequent solder reflow process. Since no access features have to be put in the suspension load beam to allow for access of termination tooling, a suspension with a very compact and stiff load/unload end tab for riding on a ramp (not shown) is possible. This results in a suspension that has optimal frequency characteristics for high track density, and ramp load/unload characteristics for very small disk spaces.

Figure 12A:
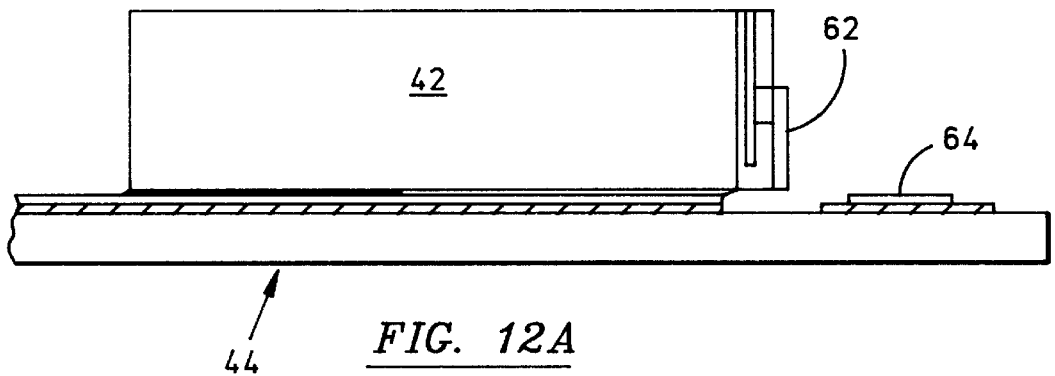
FIG. 12A shows the slider bonded to the suspension in a position for receiving solder.
Figure 12B:
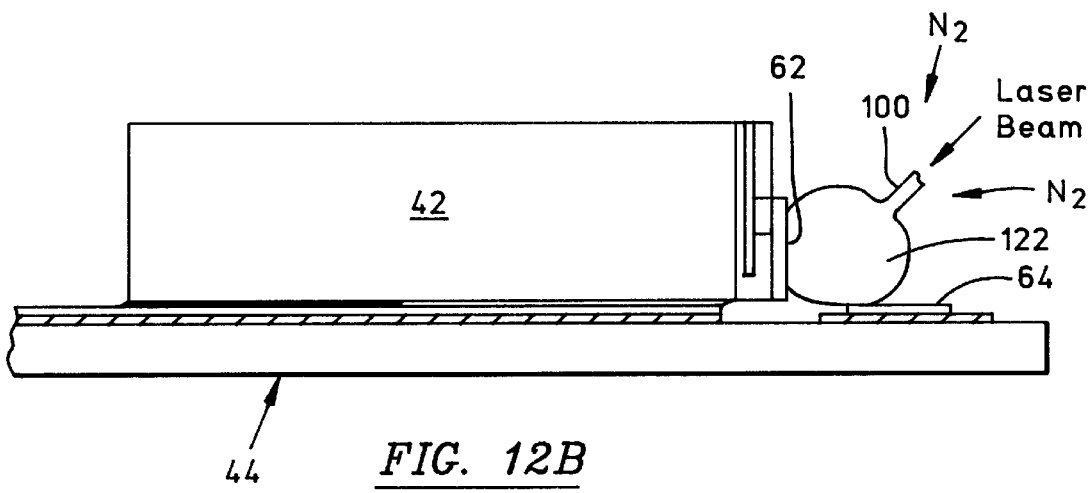
FIG. 12B shows a common solder wire ball bumped against the slider pad and the suspension pad at an angle and being heated by a laser beam for reflow.
Figure 12C:
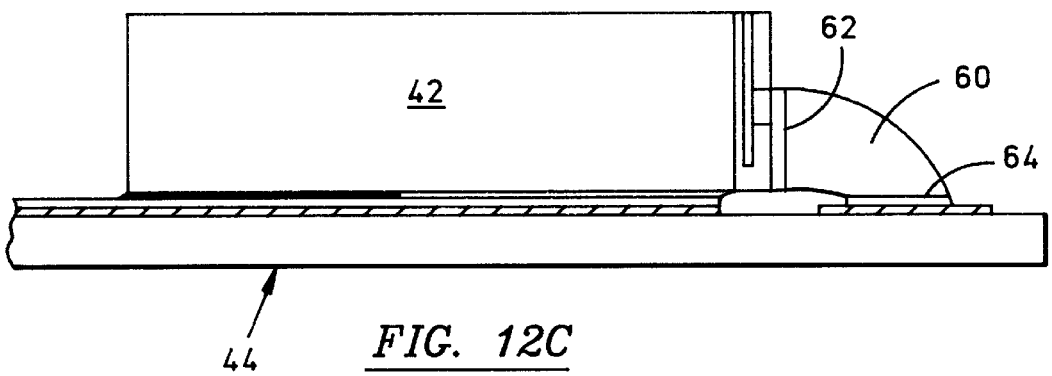
FIG. 12C shows the right angled fillet joint after reflow making a connection between the slider pad and the suspension pad.

Another embodiment of the invention is shown in FIGS. 12A–12C. In FIG. 12A the slider 42 is affixed to the suspension 44 so that the slider pad 62 and the suspension pad 64 are adjacent one another for reflow of solder. A solder ball, produced at the end of the capillary from solder wire, is bumped against each of the slider pad 62 and the suspension pad 64 simultaneously to produce solder bump 122, as shown in FIG. 12B. Accordingly, the slider pad 62 and the suspension pad 64 are bumped by a common solder ball. This solder ball may be bumped by the aforementioned tool. The steps shown in FIGS. 6A, 6B, 6C and 6D may be employed for applying the solder bump 122 with the exception that the capillary tube is directed at approximately 45° to each of the pads 62 and 64. This angle may vary provided the solder bump 122 bumps both of the pads 62 and 64. The solder bump 122 is then subjected to heat by the laser beam in an inert gas cover to cause reflow which results in the solder connection 60 between the slider pad 62 and the suspension pad 64, as shown in FIG. 12C.

In all embodiments the laser reflow step provides a superior solder joint. Most common soldering alloys contain tin as a constituent and the most common base metal to be soldered is copper or copper alloy with or without a gold finish. During conventional soldering operations (infrared or convective furnace reflow, hot gas reflow etc.) the molten solder interacts with the base metal and/or the finish to form what is known as intermetallic compounds (IMC). IMC can be copper-tin, copper-gold or combinations. IMC forms a distinct layer between the base metal (copper) and solder. The thickness of this layer is controlled by the reflow temperature and time. In conventional reflow processes solder may stay molten from an amount of time extending from a few seconds to a few minutes. As a result an IMC layer of several microns is formed. Moreover, due to a slower solidification process following reflow, the grain size of the solder is fairly large, of the order of several microns (5–10 typically) due to diffusional processes aiding in grain growth. Laser beam reflow provides extremely rapid heating and cooling. By using a laser beam to melt the solder preform (a ball or a wire bump) the solder remains molten only for a very small fraction of a second. The reflow times are in the range of 1–50 milliseconds. As a result the solder joint exhibits two unique features: (1) an IMC layer which is extremely thin, less than 1 micron combined with (2) an extremely fine grain structure, in the range of 0.1–2 micron in size. These features provide excellent mechanical properties and reliability to the joint and can be easily identified by cross-sectioning of the joint.

Solder alloys suitable for the invention can be tin-based solder alloys like 63% Sn-37% Pb, 97% Sn-3% Ag and 90% Sn-10% Au which can be produced as fine solder wires. Slider pads employed in the embodiments were 100 $\mu$m by 120 $\mu$m in area. The preferred process for bumping is solder wire bumping employing fine solder wire 25 $\mu$m to 50 $\mu$m in diameter. The pad metallurgy on slider for such an application is not limited to copper with immersion gold and any solder wettable metallurgy including a plated gold or nickel/gold finish can be used.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawings.

We claim:

1. A method of making a solder fillet connection between an electrical pad on a slider ("slider pad") and an electrical pad on a suspension ("suspension pad") comprising:

forming a flattened solder bump on the suspension pad that has a projected ball shape upon reflow;

forming a solder bump on the slider pad that has a solder wire tail;

affixing the slider to said suspension so that the solder wire tail is located within said projected ball shape; and employing a laser beam to reflow said solder bumps to form said solder fillet electrical connection between the slider pad and the suspension.

2. A method as claimed in claim 1 wherein the suspension includes a lamination of an insulation layer sandwiched between a support layer and a conductor layer and said conductor layer includes said suspension pad.

3. A method as claimed in claim 1 wherein:

ultrasonic energy is employed for said bumping.

4. A method as claimed in claim 1 including:

the slider pad being substantially flat; and the step of bumping including forming the solder wire tail at substantially 90° to the slider pad.

5. A method of making a solder fillet connection between an electrical pad on a slider ("slider pad") and an electrical pad on a suspension ("suspension pad") comprising:

providing a tool with a surface adjacent the slider pad in a location reserved for said suspension pad;

said surface being of a material to which solder does not stick;

bumping the surface and the slider pad with a common solder bump;

separating the tool from the slider;

affixing the slider to the suspension with the slider pad in said reserved location; and reflowing said common solder bump to form said solder fillet electrical connection between the slider pad and the suspension pad.

6. A method as claimed in claim 5 including: each of the slider pad and the surface of the tool being substantially flat; and bumping at an angle of substantially 90° to the slider pad.

7. A method as claimed in claim 5 including:

each of the slider pad and the surface of the tool being substantially flat; and bumping at an angle of substantially 45° to each of the slider pad and the surface of the tool.

8. A method of making solder connections between first and second pairs of electrical slider pads on a slider and first and second pairs of electrical suspension pads on a suspension respectively wherein the suspension has a spring force for loading an air bearing surface (ABS) of the slider on a magnetic disk comprising the steps of:

solder bumping the first and second pairs of sliders pads on the slider with first and second pairs of solders bumps;

attaching the slider to the suspension with the first and second pairs of solder bumps adjacent the first and second pairs of suspension pads respectively;

employing the spring force of the suspension for biasing the first and second pairs of suspension pads into engagement with the first and second pairs of solder bumps respectively; and reflowing the first and second pairs of solder bumps to make said solder connections between the slider pads and the suspension pads.

9. A method as claimed in claim 8 wherein each of the slider pads and the suspension pads are substantially flat and the step of affixing positions a plane of the slider pads and a plane of the suspension pads substantially 90° with respect to one another.

10. A method as claimed in claim 9 wherein the step of solder bumping includes the steps of:

providing a tool with a surface which is made of a material which will not stick to solder;

locating the surface of the tool adjacent a location reserved for the first and second pairs of suspension pads;

solder bumping the surface of the tool and the slider pad with a common solder bump; and separating the slider from the tool so that said attaching step can be performed.

11. A method as claimed in claim 10 wherein each of the slider pad and the surface of the tool are substantially flat and the step of solder bumping includes solder bumping at an angle other than 90° to each of the slider pad and the surface of the tool.

12. A method as claimed in claim 11 wherein the step of solder bumping the surface of the tool and the slider pad provides each of the solder bumps with a flattened portion.

13. A method as claimed in claim 12 wherein each of the slider pads and the suspension pads are substantially flat and the step of affixing positions a plane of the slider pads and a plane of the suspension pads substantially 90° with respect to one another.

14. A method as claimed in claim 13 wherein ultrasonic energy is employed for said solder bumping.

15. A method as claimed in claim 14 wherein each of the slider pad and the surface of the tool are substantially flat and the step of solder bumping includes solder bumping at an angle of substantially 45° to each of the slider pad and the surface of the tool.

16. A method as claimed in claim 15 wherein the insulation layer, the support layer and the conductive layer are a polyimide layer, a stainless steel layer and a copper layer respectively.

17. A method as claimed in claim 8 wherein the step of solder bumping includes solder wire bumping.

18. A method as claimed in claim 8 wherein the slider bumping step flattens a portion of each bump with a flattened surface for engaging a respective suspension pad after the step of attaching.

19. A method as claimed in claim 8 wherein ultrasonic energy is employed for said solder bumping.

20. A method as claimed in claim 8 wherein the insulation layer, the support layer and the conductive layer are a polyimide layer, a stainless steel layer and a copper layer respectively.

21. A method as claimed in claim 8 wherein each slider pad is substantially flat and the step of solder bumping includes solder bumping at an angle other than 90° to each of the solder pads.

22. A method as claimed in claim 8 wherein each slider pad is substantially flat and the step of solder bumping includes solder bumping at an angle other of 45° to each of the solder pads.

23. A method as claimed in claim 8 wherein the step of solder bumping includes the steps of:
 providing a tool with a surface which is made of a material which will not stick to solder;
 locating the surface of the tool adjacent a location reserved for the first and second pairs of suspension pads;
 solder bumping the surface of the tool and the slider pad with a common solder bump; and
 separating the slider from the tool so that said attaching step can be performed.

24. A method as claimed in claim 23 wherein the step of solder bumping the surface of the tool and the slider pad provides each of the solder bumps with a flattened portion.

25. A method as claimed in claim 24 wherein each of the slider pad and the surface of the tool are substantially flat and the step of solder bumping includes solder bumping at an angle other than 90° to each of the slider pad and the surface of the tool.

26. A method as claimed in claim 24 wherein each of the slider pad and the surface of the tool are substantially flat and the step of solder bumping includes solder bumping at an angle of substantially 45° to each of the slider pad and the surface of the tool.

27. A method as claimed in claim 24 wherein said biasing step includes discretely biasing each of the first and second pairs of suspension pads into engagement with said first and second slider pads respectively.

28. A method as claimed in claim 24 wherein said spring force is implemented by a single sprung component of the support layer.

29. A method as claimed in claim 24 wherein said spring force is implemented by first and second sprung components of the support layer for biasing said first and second suspension pads into engagement with said first and second slider pads respectively.

30. A method as claimed in claim 24 wherein the step of attaching includes attaching a surface of the slider opposite said ABS directly to a surface of the support layer.

31. A method as claimed in claim 30 wherein the suspension is a lamination of an insulation layer sandwiched between a spring like support layer and a conductive layer, the method comprising the steps of:
 after the steps of attaching and biasing leaving only a portion of the insulation layer between the support layer and a surface of the slider opposite said ABS with a space between said insulation layer and said surface; and;
 during the step of reflowing allowing the suspension to collapse toward the slider closing said space so that said surface of the slider opposite the ABS engages said portion of the insulation layer.

32. A method as claimed in claim 31 wherein said biasing step includes discretely biasing each of the first and second pairs of suspension pads into engagement with said first and second slider pads respectively.

33. A method as claimed in claim 31 wherein said spring force is implemented by first and second sprung components of the support layer for biasing said first and second suspension pads into engagement with said first and second slider pads respectively.

34. A method as claimed in claim 33 wherein each slider pad is substantially flat and the step of solder bumping includes solder bumping at an angle other than 90° to each of the solder pads.

35. A method as claimed in claim 8 wherein said biasing step includes discretely biasing each of the first and second pairs of suspension pads into engagement with said first and second slider pads respectively.

36. A method as claimed in claim 8 wherein said spring force is implemented by a single sprung component of the support layer.

37. A method as claimed in claim 8 wherein said spring force is implemented by first and second sprung components of the support layer for biasing said first and second suspension pads into engagement with said first and second slider pads respectively.

38. A method as claimed in claim 37 wherein the step of attaching includes attaching a surface of the slider opposite said ABS directly to a surface of the support layer.

39. A method as claimed in claim 38 wherein the suspension is a lamination of an insulation layer sandwiched between a spring like support layer and a conductive layer, the method comprising the steps of:
 after the steps of attaching and biasing leaving only a portion of the insulation layer between the support layer and a surface of the slider opposite said ABS with a space between said insulation layer and said surface; and
 during the step of reflowing allowing the suspension to collapse toward the slider closing said space so that said surface of the slider opposite the ABS engages said portion of the insulation layer.

40. A method as claimed in claim 39 wherein the step of solder bumping includes the steps of:
 providing a tool with a surface which is made of a material which will not stick to solder;
 locating the surface of the tool adjacent a location reserved for the first and second pairs of suspension pads;
 solder bumping the surface of the tool and the slider pad with a common solder bump; and
 separating the slider from the tool so that said attaching step can be performed.

41. A method as claimed in claim 8 wherein the suspension is a lamination of an insulation layer sandwiched between a spring like support layer and a conductive layer, the method comprising the steps of:

after the steps of attaching and biasing leaving only a portion of the insulation layer between the support layer and a surface of the slider opposite said ABS with a space between said insulation layer and said surface; and during the step of reflowing allowing the suspension to collapse toward the slider closing said space so that said surface of the slider opposite the ABS engages said portion of the insulation layer.

42. A method as claimed in claim 8 wherein the step of attaching includes attaching a surface of the slider opposite said ABS directly to a surface of the support layer.

43. A method as claimed in claim 42 wherein the suspension is a lamination of an insulation layer sandwiched between a spring like support layer and a conductive layer, the method comprising the steps of:

after the steps of attaching and biasing, leaving only a portion of the insulation layer between the support layer and a surface of the slider opposite said ABS with a space between said insulation layer and said surface; and during the step of reflowing allowing the suspension to collapse toward the slider closing said space so that said surface of the slider opposite the ABS engages said portion of the insulation layer.

44. A method as claimed in claim 43 wherein said biasing step includes discretely biasing each of the first and second pairs of suspension pads into engagement with said first and second slider pads respectively.

45. A method as claimed in claim 43 wherein said spring force is implemented by a single sprung component of the support layer.

46. A method as claimed in claim 43 wherein said spring force is implemented by first and second sprung components of the support layer for biasing said first and second suspension pads into engagement with said first and second slider pads respectively.

47. A method of making a solder connection between a substantially flat electrical pad on a slider ("slider pad") and a substantially flat electrical pad on a suspension ("suspension pad") after a wafer of sliders has been diced into sliders, the method comprising:

after said dicing, affixing a slider to said suspension;

forming a solder bump with solder wire on the slider pad and on the suspension pad at an angle of substantially 45° to each of the slider pad and the suspension pad; and employing a laser beam to reflow said solder bump to form a solder fillet electrical connection between the slider pad and the suspension pad.

48. A method as claimed in claim 47 including:

the step of affixing including positioning a plane of the slider pad and a plane of the suspension pad substantially 90° with respect to one another.

49. A method as claimed in claim 48 wherein:

the suspension including a lamination of an insulation layer sandwiched between a suspension layer and a conductor layer, said conductor layer including said suspension pad.

50. A method as claimed in claim 49 wherein said bumping is done by ultrasonic energy.

51. A method of making a solder connection between a substantially flat electrical pad on a slider ("slider pad") and an electrical pad on a suspension ("suspension pad") after a wafer of sliders has been diced into sliders, the method comprising:

after said dicing, providing a tool with a substantially flat surface adjacent a slider pad in a location reserved for a suspension pad;

said flat surface being of a material to which solder does not stick;

bumping with solder wire the flat surface and the slider pad with a common solder bump at an angle of substantially 45° to each of the slider pad and the flat surface of the tool;

separating the tool from the slider pad;

affixing the slider to said suspension; and reflowing said common solder bump to form said solder connection between the slider pad and the suspension pad.

52. A method as claimed in claim 51 including:

the suspension being for loading the slider on a magnetic disk; and the step of affixing including aligning the slider pad with the suspension pad to bias the suspension pad against the solder bump on the slider pad.

53. A method as claimed in claim 52 wherein:

the suspension pad is substantially flat; and the step of affixing includes positioning a plane of the slider pad and a plane of the suspension pad substantially 90° with respect to one another.

54. A method as claimed in claim 53 wherein:

the suspension includes a lamination of an insulation layer sandwiched between a suspension layer and a conductor layer, said conductor layer including the suspension pad.

55. A method as claimed in claim 54 wherein said bumping being done by ultrasonic energy.

56. A method as claimed in claim 55 wherein said step of affixing includes affixing a surface of the slider directly to a surface of the suspension layer.

* * * * *